United States Patent [19]

Taylor

[11] 4,298,407

[45] Nov. 3, 1981

[54] FLUX TREATED SOLDER POWDER COMPOSITION

[75] Inventor: Barry E. Taylor, Youngstown, N.Y.

[73] Assignee: E. I. Du Pont de Nemours and Company, Wilmington, Del.

[21] Appl. No.: 175,272

[22] Filed: Aug. 4, 1980

[51] Int. Cl.$^3$ ............................................ B23K 35/34
[52] U.S. Cl. ...................................... 148/24; 228/223
[58] Field of Search .................................. 148/23–25; 228/223–224

[56] References Cited

U.S. PATENT DOCUMENTS

| | | | |
|---|---|---|---|
| 2,898,255 | 8/1959 | Thompson et al. | 148/23 |
| 3,436,278 | 4/1969 | Poliak | 148/23 |
| 3,617,345 | 11/1971 | Brown | 148/23 |
| 4,165,244 | 8/1979 | Jacobs | 148/23 |
| 4,168,996 | 9/1979 | Zado | 148/23 |

FOREIGN PATENT DOCUMENTS

| | | | |
|---|---|---|---|
| 46-17569 | 5/1971 | Japan | 148/23 |
| 46-34211 | 10/1971 | Japan | 148/23 |
| 4026826 | 7/1974 | Japan | 148/23 |
| 50-21308 | 7/1975 | Japan | 148/23 |

*Primary Examiner*—P. D. Rosenberg

[57] ABSTRACT

Tin alloy solder powder compositions comprising finely divided particles of the alloy coated with a thin continuous layer of organic flux sufficient to lower the electrical conductivity and to obscure the eutectic domains on the surface of the alloy particles.

28 Claims, 4 Drawing Figures

FLUX TREATED SOLDER POWDER COMPOSITION

FIELD OF THE INVENTION

The invention relates to solder compositions, especially solder powder compositions which have been treated with flux.

BACKGROUND OF THE INVENTION

Solders are low melting metal alloys which can be melted to join other metals having higher melting points. The technology of such materials, which are usually low melting alloys of tin, lead, bismuth, silver and similar metals, has been developed over a period of several hundred years. Nevertheless, even though the basic technology is much older, the last thirty years, which many consider to be the dawn of the electronic age, have produced many significant advances.

A significant area of improvement in solder paste technology involves the use of organic acids as fluxing agents. A 1949 patent (U.S. Pat. No. 2,470,957) issued to J. E. Strader discusses the use of glutamic acid hydrochloride as a solder flux constituent. Other organic acids used as solder fluxes include lactic, oleic, stearic, glutamic and phthalic acids (see "Solders and Soldering" by Howard H. Manko, McGraw-Hill Book Co., 1964). Many of these acids are successfully used in applications where the residues left after the soldering operation can be washed away using water as a solvent. Hence they have been widely promoted as water-soluble flux systems.

Although water-soluble organic acids can give more active fluxing action than the so-called water-white rosin fluxes, they sometimes are too corrosive for delicate soldering applications. Because of the potential corrosiveness of organic acids, many patents have issued related to more complex organic esters, alcohols and amines, which retain a high level of flux activity without having the corrosiveness of their acid counterparts. Examples of such organic fluxes are those disclosed in U.S. Pat. Nos. 4,180,616; 4,092,182; 3,944,123; 3,675,307 and 3,099,590. The fluxes disclosed in U.S. Pat. No. 4,180,616 are derivatives of bile acids, for example cholic acid. These acids are not as chemically reactive as the shorter chain aliphatic acids, and are therefore not as corrosive in soldering applications.

The corrosiveness of a solder flux in a given application is strongly dependent on the amount of the particular flux present, as well as the chemical nature of the other organic chemicals present. Therefore, the corrosiveness of short chain aliphatic acids (e.g., succinic acid) may be fairly high if the concentration is high and if no other organic chemcials are present to neutralize the acidity during the soldering operation. However, if a low concentration of succinic acid is used as a component of an otherwise unactivated flux system, the overall corrosiveness is low.

When organic acids are incorporated into water soluble flux systems, relatively high concentrations of the acids are generally used. Upon completion of the soldering operation, these acids and their residues must be cleaned off by washing with solvents. However, many microelectronic applications cannot tolerate water cleanup after the soldering operation. Therefore, it would be advantageous to find a way to use organic acids efficiently in systems requiring organic solvent cleanup.

The amount of organic acids used in typical solder fluxes disclosed in the prior art varies greatly, but the total amount of organic acids is generally greater than 1% by weight. It has been found however, that organic acid concentrations higher than 1% lead to difficulty in cleaning the flux residues after soldering, particularly when organic solvent cleaners are used. For example, U.S. Pat. No. 2,898,255 discloses the use of organic acids such as oxalic, malonic, succinic, glutamic and adipic acids in rosin-based solder fluxes. The amount of dicarboxylic acid needed to give satisfactory performance is claimed to be 1–13.5% by weight.

U.K. Pat. No. 1,458,351 discusses use of unsaturated $C_{12}-C_{36}$ aliphatic monocarboxylic acids in conjunction with rosin. It also mentions fluxes containing one or more aliphatic or alicyclic dicarboxylic acids such as succinic, azelaic, sebacic, fumaric and hydrophthalic acid. However, the maximum and minimum amounts of acids that are acceptable are not disclosed.

Other commonly known flux systems are organic esters, amines, alcohols, phosphates and long chain aliphatic monocarboxylic acids, e.g., stearic acid and derivatives of such materials.

One of the problems with the prior art fluxes is that they are difficult to use in that they must often be used in excessively high concentrations to perform their function of effectively cleaning the metal surfaces to be joined. As mentioned above, these materials must be cleaned off the solder assemblage. On the other hand, when small concentrations of flux are used, insufficient surface cleaning results and a poor solder joint is obtained. This is frequently indicated by the occurrence of low metal retention and solder balling.

The term "solder balling" refers to the undesirable tendency of a solder paste, when heated during reflow, to form small spheres of solder instead of forming a single solder fillet. Solder balling is primarily caused by incomplete removal of surface oxides during the early stages of the reflow process. These oxides retard or prohibit the coalescence of the solder when heated to the melting temperature. The occurrence of solder balling directly affects the amount of solder alloy present in the metal joint. The term "metal retention" is commonly used to express the comparison between the theoretical amount of solder alloy in the solder paste and the amount of solder actually deposited at the metal joint. Metal retention is expressed in percent and is calculated by the following equation:

$$\text{Metal Retention (\%)} = \frac{\text{Amount of Solder Deposited}}{\text{Amount of Solder Alloy in Paste}} \times 100$$

Metal retention values greater than 85% are generally acceptable, and values approaching 100% are ideal.

BRIEF DESCRIPTION OF THE INVENTION

The problems of prior art fluxes with respect to efficiency in use are considerably reduced by the invention which is directed to a tin alloy solder powder composition comprising finely divided particles of tin alloy coated with a thin substantially continuous layer of organic flux sufficient to lower the electrical conductivity of the surface of the alloy particles and also to obscure the eutectic metal domains on the surface of the alloy particles. In a second aspect the invention is directed to screen printable pastes of such powders and to the method of joining solderable metal surfaces therewith. In a still further aspect the invention is directed to the method for making such flux coated solder compositions.

DETAILED DESCRIPTION OF THE INVENTION

A. Solder Alloy Composition

Figure 1A:
FIGS. 1A and 1B are scanning electron microscope (SEM) photographs of untreated tin/lead solder particles taken at 3000 X and 6000 X magnification.

The invention is applicable to all tin-containing solder alloys such as tin/lead, tin/bismuth, and tin/silver in finely divided form. The preferred particle size diameter for the alloys to be used for the invention is 5–30 μm. Fine particles (e.g., 5 μm) are generally used in applications such as syringe dispensing and screen printing, whereas the coarser particles (e.g., 15–30 μm) are generally used in stencil applications.

B. Flux Composition

A wide variety of organic flux compositions can be used in the invention including both mono- and polycarboxylic acids, esters, amines, alcohols and phosphates. Since their functon is the same, the selection of particular flux materials for particular applications is within the skill of the art. Nevertheless, organic acids and especially organic dicarboxylic acids have been found to give superior performance. Succinic acid and salicylic acid are particularly preferred.

The invention is based upon the discovery that effective flux compositions for tin alloys have the ability to dissolve tin oxides and therefore effectively clean the surface of tin containing solder powders.

The ability to provide clean powder surfaces has fundamental importance in the soldering operation. When small amounts of oxide impurities are present on the powder, they interfere with the solder's ability to coalesce the metal when it is heated above the melting point. When oxides are present, the phenomenon known as "solder balling" occurs, which leads to small balls of solder around the perimeter of the soldered device. Such solder balls are troublesome because they must be completely cleaned away least they lead to electrical short circuits.

The choice of flux is dictated primarily by the performance characteristics desired. The flux must melt at a low enough temperature effectively to dissolve the oxide coating on the solder powder before the melting temperature of the solder is reached. The flux must not volatilize before the solder melting process is complete, and must not char or form insoluble residues during the solder reflow process. Furthermore, for most of the applications described below, the flux must not be present in such high concentrations that the residues after soldering become insoluble in common organic solvents such as methylene chloride, methanol, Freon ® fluorocarbons and choroethane. In the present invention the ability to be cleaned in common organic solvents is of primary importance, although the invention is equally applicable for solder compositions requiring aqueous solvent cleaning.

The amount of flux used to coat the solder alloy particles is determined in large part by the solubility of the flux residues after solder reflow. Thus, at least 0.1% by weight basis total coated particle weight is needed. The maximum amount of flux coating which can be used is subjective to the solubility of the flux in whatever solvent is used for cleaning the soldered assemblage.

In organic solvent systems using short chain aliphatic dicarboxylic acid the preferred range is 0.1–0.5% of the total solids mixture. For aromatic carboxylic acids such as salicylic acid the preferred amount of acid is 0.1–1.0%. At the high limit (1%) soldered parts can be satisfactorily cleaned with organic solvents as long as care is exercised. To insure optimum cleaning and reflow properties it is advantageous to use a mixture of organic acids so that the activity will be as high as practical without any deleterious effect on cleaning. An example of such a mixed acid system is 0.5% succinic acid and 0.5% salicylic acid. The mixed system offers optimum reflow properties with negligible solder balling and offers easy cleanup in organic solvent.

Because fluxes which are effective for tin oxides are not very effective for lead oxides it is necessary to incorporate into the solder systems of the invention an effective flux for lead oxide when lead-containing solder alloys are used in the invention. Suitable lead oxide fluxes are $C_{1-8}$ alkanols and alkyl amines corresponding to the following formula:

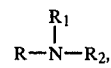

wherein the R groups are independently selected from the group consisting of H, $C_{1-18}$ alkyl, $C_{2-4}$ alkenyl and $C_{1-4}$ hydroxyalkyl, at least one of the R groups being alkyl or hydroxy alkyl.

Preferred fluxes of this type are the monoalkyl amines such as isopropyl amine and especially the polyalkanol amines such as triethanolamine.

Liquid amine fluxes such as triethanolamine are generally not coated onto the solder particles because the resultant powders are somewhat difficult to handle. Therefore, liquid amines are generally incorporated as a component of the organic medium before the paste is made or they can be added as a separate component in the paste. For optimum performance, it has been found that the above-described amine fluxes should be added to both the organic medium and to the paste formulation. The amount of amine flux in the final paste composition should be 0.25–3% and preferably 0.4–1.5% by weight, basis total paste.

If dry amine fluxes are used, they may be incorporated with the solid organic acid fluxes, thereby giving a homogeneous, well dispersed surface coating and providing more efficient utility.

Those skilled in the art will realize that other fluxes not specifically mentioned in this case can be used as surface coatings on solder alloy powders by the process described herein.

C. Flow Coating Process

The method for coating the tin alloy solder particles with flux is, in one sense, quite simple in that it requires only intimate admixing of the solder particles and flux to effect coating of the particles. Nevertheless, this process must be carefully controlled.

Though other mixing processes in which effective surface contact is achieved can be used, a preferred coating method is bead milling.

Because solder alloys are relatively soft it is important to keep the milling times as short as possible so that there is little or no increase in the powder particle size. The object of the milling process is to mix and coat the powders uniformly with the organic flux. Once a uniform mixture has been obtained, the milling operation should be stopped. The uniformity of the mixture can be determined with a functional test of the solder powder by measuring metal retention and extent of solder balling. If the mixture is inhomogeneous, the extent of solder balling will be excessive and the metal retention value will be low.

Scanning electron microscopy and particle size distribution can be used to determine the extent of particle coarsening as a result of milling. Coarsening should not exceed 30% of the mean particle size diameter and preferably no more than 20%. Thus, if the mean particle size before milling is 20 μm, the mean particle size after milling should not exceed 26 μm.

A particularly preferred milling process involves the use of bead milling using 6 mm glass beads and a ceramic jar mill. The preferred process illustrated in the examples below employs a quart jar mill with 400 ml of 6 mm glass beads and 100–600 grams of solder alloy powder. The alloy powder is placed in the mill along with the dry organic flux and the mixture is blended for approximately one hour by rotation. The rotation rate is not critical, but rates of 60–70 rpm have given acceptable results. After the powders have been milled they are screened to remove the glass beads and any large agglomerates of solder powder which may have formed during the milling operation.

The preferred method of bead milling to produce a well-dispersed and uniform coating is most easily adaptable for solid fluxes, but can also be satisfactorily used with liquid fluxes and solutions of fluxing agents. When solutions are employed, the solvents can be removed by drying under an inert atmosphere or under vacuum.

The resultant flux-coated alloy powders produced by intimate mixing such as bead-milling have a noticeably different surface chemistry than unmilled powders. Scanning electron micrographs and Energy Dispersive Analysis by X-ray (EDAX) show that the powder surfaces are not as conductive after milling, presumably because of the insulating layer or organic acid. EDAX also shows that the normal eutectic structure on the surface of the particle is not as well defined after the bead milling process, indicating that lead and tin metals on the powder surface have been smeared out by the rubbing action with the glass beads. The normal eutectic structure of 63 Sn/37 Pb solder powders shows visibly well-defined domains that are rich in lead metal and other domains that are rich in tin. The surface concentrations of lead and tin after milling are significantly more uniform and the eutectic domains are visibly obscured.

Figure 1B:
Figure 2A:
FIGS. 2A and 2B are SEM photographs taken at 3000 X and 6000 X magnification of tin/lead solder particles which have been coated in accordance with the invention.
Figure 2B:

The above described obscuration of the eutectic domains can be observed very clearly by comparison of the untreated solder particles of FIGS. 1A and 1B with the treated particles of FIGS. 2A and 2B. As they appear in the SEM pictures, the light colored domains are lead and the dark domains are tin.

The invention will be even better observed and understood by reference to the following examples.

D. Organic Medium

The purpose of the organic medium is to disperse and coat the metal alloy powders. The medium also acts as a flux during solder reflow to clean the powder surface of undesired metal oxides and other contaminants.

The medium is generally composed of a mixture of organic liquids, fluxing agents and thixotropes. Exemplary of the organic liquids which can be used are the aliphatic alcohols, esters of such alcohols, for example, the acetates and propionates, terpenes such as pine oil, terpineol and the like. The vehicle may also contain volatile liquids to promote fast setting after application to the substrate.

The ratio of liquid vehicle to solids in the solder paste compositions of this invention can vary considerably and depends upon the manner in which the dispersion of solder composition in vehicle is to be applied and the kind of vehicle used. Generally, from 0.5 to 20 parts by weight of solids per part by weight of vehicle will be used to produce a dispersion of the desired consistency. Preferred dispersions contain 10–50% vehicle, and, still more preferably, 15–30% vehicle.

The method of preparing the organic medium is as follows. The organic components, for instance those described in Example I below, are mixed with heating to about 100° C. until a uniform and homogeneous solution is obtained. It is particularly important to insure that heating is carried out at a sufficient temperature and for long enough time to completely dissolve all staybelite wood rosin and thixotrope. When a clear liquid has been obtained it is poured into a separate container and allowed to cool gradually, to ambient temperature.

The viscous liquid obtained after complete cooling can be mixed with metal powders as described in the examples below. The method of mixing is not critical but should insure that a homogeneous dispersion of metal and organic phases is obtained. Blenders and common rotating blade mixers can be used satisfactorily.

Once the powders and organic medium have been completely mixed, it is often desirable to formulate the resulting paste to a specific viscosity. Before the paste is formulated, it should be allowed to stand for several hours so that a "rest" viscosity can be obtained. To obtain the desired viscosity a solvent such as beta-terpineol is generally added if viscosity is too high or more solder powder is added if viscosity is too low. The paste is then allowed to stand again before remeasuring viscosity. Pastes made by this procedure generally have predictable viscosity characteristics and can be formulated easily.

The solder compositions of the invention either in particulate or paste form can also be applied to substrate to be joined by lamination, imagewise exposure and development in dry film photoresist of which the solder is dispersed in the photosensitive layer.

EXAMPLE I

A one quart ceramic jar mill was charged with 400 ml of glass beads (6 mm diameter), 200 gr of −400 mesh 62 Sn/36 Pb/2 Ag solder powder and 1 gr glutamic acid hydrochloride. After milling for one hour the mill was discharged and the powder was passed through a −60 mesh screen. The powder was mixed with an organic medium consisting of approximately 4% thixotrope, 45% staybelite wood rosin, 19% triethanolamine and 32% beta-terpineol in a ratio of 4 parts powder to 1 part medium by weight. The resulting paste was printed onto prefired thick film conductor patterns on alumina substrates and heated rapidly to 230° C., held at temperature for 10 seconds and rapidly cooled to room temperature. The resulting soldered conductor exhibited essentially no solder balling.

EXAMPLE II

The procedure described in Example I was repeated using 400 gr of a coarser solder powder (−200 to +400 mesh) and 1 gr of glutamic acid hydrochloride. After solder reflow the test parts were examined under a microscope and no solder balls were observed. This example illustrates that the particle size of the solder alloy powder is not critical in the bead milling process.

EXAMPLE III

The procedure described in Example I was repeated using succinic acid instead of glutamic acid hydrochloride. A paste was made using 85 gm of the resultant powder, 13 gr of the medium described in Example I, 1 gr of triethanolamine and 1 gr of beta-terpineol. Conductor patterns printed with this paste and then reflowed at 230° C. gave negligible solder balling and a metal retention value of 98%.

EXAMPLE IV

Example III was repeated using a −325 mesh spherical 62 Sn/36 Pb/2 Ag solder powder. The soldered test parts after reflow showed negligible solder balling and had a metal retention value greater than 95%.

EXAMPLE V

Example III was repeated using a −200 to +400 mesh irregular 62 Sn/36 Pb/2 Ag solder powder. Again the soldered test parts showed negligible solder balling and had a metal retention value of approximately 100%. Examples III, IV and V illustrate that excellent metal retention values and minimal solder balling can be achieved, regardless of the particle size of the powder precursor.

EXAMPLE VI

To illustrate that the bead mill process could be employed advantageously with larger batch sizes, a one gallon mill was charged with 2 Kgr of −400 mesh 62 Sn/36 Pb/2 Ag powder, 10 gr succinic acid and 1600 ml of 6 mm glass beads. The mill was rotated at 32 rpm for 1 hour and then discharged through a −60 mesh screen. After screening, 4.5 gr of succinic acid was collected. The metal retention value of the resultant paste was 82%.

The succinic acid residue was ground to −100 mesh and was recharged into the mill. After an additional one hour's milling at 42 rpm, the mill was discharged through a 60 mesh screen. Essentially no residue was collected on the 60 mesh screen. A paste made with the remilled powder gave 99% metal retention.

This example illustrates the effect of incomplete milling on solder reflow characteristics. The example also illustrates that dry organic fluxes preferably should be initially passed through a −100 mesh screen to obtain more effective coating of the particles.

EXAMPLE VII

To illustrate the advantages of bead milled powder over powders cleaned by conventional mineral acid techniques, a comparison was made between different particle size powders treated by the two different methods. The results of the comparison are given in Table I.

TABLE I

Comparison of Metal Retention Values For Powders Treated by the Bead Mill Process and by Conventional Processing

| | Metal Retention Value, % | |
|---|---|---|
| | Conventional Processing | Bead Mill Processing |
| −325 Mesh spherical powder | 84% | 96% |
| −200 to +400 Mesh irregular powder | 98% | 98% |
| −400 Mesh irregular powder | 82% | 99% |

EXAMPLE VIII

The procedure described in Example III was repeated using an irregular −400 mesh 95 Sn/5 Ag alloy powder. Paste made from the powder using the organic vehicle described in Example I gave negligible solder balling and had a metal retention value of 95%.

EXAMPLE IX

Example VIII was repeated using spherical −325 mesh 95 Sn/5 Ag powder. Paste made from the powder gave minimal solder balling and a metal retention value of 99%.

EXAMPLE X

Example III was repeated using an irregular −400 mesh 60 Sn/40 Pb alloy. Paste made using the organic medium described in Example I gave no solder balling and had a metal retention of 100%.

EXAMPLE XI

To illustrate the effect of bead milling with various organic acids on solder balling and metal retention values, salicylic, phthalic, stearic and isophthalic acids were milled with irregular −400 mesh 62 Sn/36 Pb/2 Ag powder. Two hundred grams of powder were milled with one gram of each acid for one hour. The extent of solder balling and the metal retention values are described in Table II. Good reflow results were obtained with salicylic, phthalic and isophthalic acids.

TABLE II

| Acid Used | Extent of Solder Balling | Metal Rentention Value, % |
|---|---|---|
| Salicylic | Slight | 98 |
| Phthalic | Slight | 98 |
| Stearic | Moderate | 74 |
| Isophthalic | Slight | 98 |

EXAMPLE XII

Two hundred grams of irregular −400 mesh 62 Sn/36 Pb/2 Ag alloy were milled with one gram each of succinic and salicylic acid according to the procedure outlined in Example I. A paste was made using 85 gr of the resulting powder, 14 gr of the organic medium described in Example I and 1.5 gr of beta-terpineol. This paste gave essentially no solder balling and had a metal retention value of 99%.

EXAMPLE XIII

Two hundred grams of irregular −400 mesh 95 Sn/5 Ag alloy powder and 1 gr each of succinic and salicylic acid were milled together as outlined in Example I. A paste was made using 85 gr of the resultant powder and 15 gr of the organic medium described in Example I. The reflowed paste gave essentially no solder balling and had a metal retention value of 98%.

EXAMPLE XIV

To illustrate that incorporation of the organic flux via bead milling gives superior performance to direct incorporation of the acid into the paste, the following experiment was carried out. The untreated powders used in Examples III, IV, V, VIII and IX were mixed with the organic medium described in Example I, succinic acid and triethanolamine in the following proportions:

| | |
|---|---|
| Untreated powder | 85.0% wt. |
| Organic medium | 13.6% |
| Succinic Acid | 0.4% |
| Triethanolamine | 1% |

In each case when succinic acid was added directly to the paste, the degree of solder balling was excessive and the metal retention value was less than 85%. Powders coated with an equivalent amount of succinic acid by the bead milling technique gave metal retention values greater than 95% and exhibited negligible solder balling.

The solder powder compositions of the invention when dispersed in organic medium can be applied in a number of ways, e.g., screen printing, stenciling, syringe dispensing, rotating wheel transfer (Bender machine) or by incorporating them into the photosensitive layer of a dry film photoresist which is then laminated upon the surface to be soldered and processed by imagewise exposure and development.

I claim:

1. A tin alloy solder powder composition comprising finely divided particles of tin alloy coated with a thin substantially continuous layer of an organic flux, sufficient to lower the electrical conductivity of and to obscure the eutectic metal domains on the surface of the alloy particles.

2. The composition of claim 1 in which the flux is selected from the group consisting of organic acids, esters, amines, alcohols and phosphates.

3. The composition of claim 1 in which the flux is an organic acid.

4. The composition of claim 3 in which the organic acid is a dicarboxylic acid.

5. The composition of claim 4 in which the dicarboxylic acid is salicylic acid, succinic acid, or mixtures thereof.

6. The composition of claim 1 in which the organic flux coating comprises 0.1 to 10% of the total particle weight.

7. The composition of claim 6 for use with organic solvent cleanup in which the flux coating is 0.1 to 1.0% by weight of the coated particle.

8. A screen-printable tin alloy solder paste composition comprising finely divided particles of tin alloy coated with a thin substantially continuous layer of flux, sufficient to lower the electrical conductivity of and to obscure the eutectic metal domains on the surface of the alloy particles, dispersed in an organic medium.

9. The composition of claim 8 in which the flux is selected from the group consisting of organic acids, esters, amines, alcohols and phosphates.

10. The composition of claim 8 in which the flux is an organic acid.

11. The composition of claim 10 in which the organic acid is a dicarboxylic acid.

12. The composition of claim 11 in which the dicarboxylic acid is salicylic acid, succinic acid, or mixtures thereof.

13. The composition of claim 8 in which the organic flux coating comprises 0.1 to 10% of the total particle weight.

14. The composition of claim 13 for use with organic solvent cleanup in which the flux coating is 0.1 to 1.0% by weight of the coated particle.

15. The composition of claim 8 containing 0.3% by weight basis total composition of an organic amine which is a solvent for lead oxide and the alloy is tin/lead.

16. The composition of claim 15 for use with organic solvent cleanup in which the flux coating comprises 0.1 to 1.0% of the coated particle weight.

17. The composition of claim 15 in which the amine is a $C_{1-8}$ alkanol mono- to tetra-amine.

18. The composition of claim 16 in which the organic amine is triethanolamine.

19. The composition of claim 16 in which the amine is a $C_{1-18}$ alkyl mono- to tetra-amine.

20. The method for coating finely divided particles of tin alloy with a thin substantially continuous layer of organic flux comprising intimately admixing the particles with the flux for a time sufficient to reduce the electrical conductivity of the obscure the eutectic domains of the surface of the alloy particles.

21. The method of claim 20 in which the flux coating comprises 0.1 to 10% of the total particle weight.

22. The method of claim 20 which is carried out by means of bead milling.

23. A process for joining two solderable metal surfaces comprising (a) applying to at least one of the surfaces a film of the tin alloy paste composition of claim 8, (b) applying heat to the surfaces to volatilize organic medium therefrom and to reflow the alloy into contact with both surfaces, and (c) cooling the resultant assemblage to solidify the alloy.

24. The process of claim 23 in which the paste is applied by screen printing.

25. The process of claim 23 in which the flux is applied by lamination, imagewise exposure, and development of a dry film photoresist having the solder paste dispersed in the photosensitive layer.

26. The process of claim 23 in which the paste is applied by stenciling.

27. The process of claim 23 in which the paste is applied by syringe dispensing.

28. The process of claim 23 in which the paste is applied by rotating wheel transfer.

* * * * *

UNITED STATES PATENT OFFICE
CERTIFICATE OF CORRECTION

PATENT NO. : 4,298,407
DATED : November 3, 1981
INVENTOR(S) : Barry E. Taylor

It is certified that error appears in the above-identified patent and that said Letters Patent are hereby corrected as shown below:

Column 10, claim 20, line 40, "the" first instance, should be --and--.

Signed and Sealed this

Twenty-third Day of February 1982

[SEAL]

Attest:

*Attesting Officer*

GERALD J. MOSSINGHOFF

*Commissioner of Patents and Trademarks*